(12) United States Patent
Nazarian et al.

(10) Patent No.: US 8,988,927 B2
(45) Date of Patent: *Mar. 24, 2015

(54) NON-VOLATILE VARIABLE CAPACITIVE DEVICE INCLUDING RESISTIVE MEMORY CELL

(71) Applicant: Crossbar, Inc., Santa Clara, CA (US)

(72) Inventors: Hagop Nazarian, San Jose, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/764,710

(22) Filed: Feb. 11, 2013

(65) Prior Publication Data

US 2013/0148410 A1  Jun. 13, 2013

Related U.S. Application Data

(63) Continuation of application No. 12/815,318, filed on Jun. 14, 2010, now Pat. No. 8,411,485.

(51) Int. Cl.
| | | |
|---|---|---|
| *G11C 11/00* | (2006.01) | |
| *G11C 13/00* | (2006.01) | |
| *G11C 14/00* | (2006.01) | |
| *G11C 11/56* | (2006.01) | |
| *H01L 45/00* | (2006.01) | |
| *H01L 29/788* | (2006.01) | |

(52) U.S. Cl.
CPC ........ *G11C 13/0002* (2013.01); *G11C 14/0045* (2013.01); *G11C 11/5614* (2013.01); *G11C 13/0011* (2013.01); *H01L 45/085* (2013.01); *H01L 45/1233* (2013.01); *H01L 45/1266* (2013.01); *H01L 45/148* (2013.01); *H01L 29/7881* (2013.01); *G11C 2213/33* (2013.01); *G11C 2213/53* (2013.01)
USPC ........ 365/148; 365/185.01; 365/46; 365/149; 365/150; 365/163

(58) Field of Classification Search
USPC ............... 365/148, 185.01, 46, 149, 150, 163
See application file for complete search history.

(56) References Cited

U.S. PATENT DOCUMENTS

| | | |
|---|---|---|
| 5,499,208 A | 3/1996 | Shoji |
| 5,673,223 A | 9/1997 | Park |

(Continued)

FOREIGN PATENT DOCUMENTS

| | | |
|---|---|---|
| EP | 1096465 A2 | 2/2001 |
| KR | 10-2009-0051206 A | 5/2009 |

OTHER PUBLICATIONS

Office Action for U.S. Appl. No. 12/815,318, dated May 16, 2012.

(Continued)

*Primary Examiner* — Fernando Hidalgo
(74) *Attorney, Agent, or Firm* — Ogawa P.C.

(57) ABSTRACT

A non-volatile variable capacitive device includes a capacitor defined over a substrate, the capacitor having an upper electrode and a resistive memory cell having a first electrode, a second electrode, and a switching layer provided between the first and second electrodes. The resistive memory cell is configured to be placed in a plurality of resistive states according to an electrical signal received. The upper electrode of the capacitive device is coupled to the second electrode of the resistive memory cell. The resistive memory cell is a two-terminal device.

20 Claims, 7 Drawing Sheets

(56) References Cited

U.S. PATENT DOCUMENTS

| | | |
|---|---|---|
| 5,923,587 A | 7/1999 | Choi |
| 6,002,268 A | 12/1999 | Sasaki et al. |
| 6,181,587 B1 | 1/2001 | Kuramoto et al. |
| 6,731,535 B1 | 5/2004 | Ooishi et al. |
| 6,867,618 B2 | 3/2005 | Li et al. |
| 6,897,519 B1 | 5/2005 | Dosluoglu |
| 7,167,387 B2 | 1/2007 | Sugita et al. |
| 7,251,152 B2 | 7/2007 | Roehr |
| 7,274,587 B2 | 9/2007 | Yasuda |
| 7,345,907 B2 | 3/2008 | Scheuerlein |
| 7,515,454 B2 | 4/2009 | Symanczyk |
| 7,561,461 B2 | 7/2009 | Nagai et al. |
| 7,606,059 B2 | 10/2009 | Toda |
| 7,692,959 B2 | 4/2010 | Krusin-Elbaum et al. |
| 7,746,696 B1 | 6/2010 | Paak |
| 7,764,536 B2 | 7/2010 | Luo et al. |
| 7,869,253 B2 | 1/2011 | Liaw et al. |
| 8,054,679 B2 | 11/2011 | Nakai et al. |
| 8,102,018 B2 | 1/2012 | Bertin et al. |
| 8,243,542 B2 | 8/2012 | Bae et al. |
| 8,315,079 B2 | 11/2012 | Kuo et al. |
| 8,456,892 B2 | 6/2013 | Yasuda |
| 8,467,226 B2 | 6/2013 | Bedeschi et al. |
| 8,675,384 B2 | 3/2014 | Kuo et al. |
| 2003/0036238 A1 | 2/2003 | Toet et al. |
| 2004/0170040 A1 | 9/2004 | Rinerson et al. |
| 2007/0133250 A1 | 6/2007 | Kim |
| 2008/0043521 A1 | 2/2008 | Liaw et al. |
| 2009/0091981 A1 | 4/2009 | Park et al. |
| 2009/0251941 A1 | 10/2009 | Saito |
| 2010/0039136 A1 | 2/2010 | Chua-Eoan et al. |
| 2010/0067279 A1 | 3/2010 | Choi |
| 2010/0102290 A1 | 4/2010 | Lu et al. |
| 2010/0110767 A1 | 5/2010 | Katoh et al. |
| 2010/0171086 A1 | 7/2010 | Lung et al. |
| 2010/0182821 A1 | 7/2010 | Muraoka et al. |
| 2011/0063888 A1 | 3/2011 | Chi et al. |
| 2011/0066878 A1 | 3/2011 | Hosono et al. |
| 2011/0122679 A1 | 5/2011 | Chen et al. |
| 2011/0205780 A1 | 8/2011 | Yasuda et al. |
| 2012/0074507 A1 | 3/2012 | Jo et al. |
| 2012/0091420 A1 | 4/2012 | Kusai et al. |
| 2012/0120712 A1 | 5/2012 | Kawai et al. |
| 2012/0218807 A1 | 8/2012 | Johnson |
| 2012/0320660 A1 | 12/2012 | Nazarian et al. |
| 2013/0134379 A1 | 5/2013 | Lu |
| 2013/0235648 A1 | 9/2013 | Kim et al. |

OTHER PUBLICATIONS

International Search Report for PCT/US2011/046036, filed on Jul. 29, 2011.

Written Opinion of the International Searching Authority for PCT/US2011/046036, filed on Jul. 29, 2011.

Office Action for U.S. Appl. No. 12/900,232, dated Jul. 30, 2012.

Notice of Allowance for U.S. Appl. No. 13/051,296, dated Aug. 31, 2012.

Notice of Allowance for U.S. Appl. No. 12/900,232, dated Sep. 18, 2012.

Notice of Allowance for U.S. Appl. No. 12/815,318, dated Nov. 29, 2012.

International Search Report and Written Opinion for PCT/US2012/044077, filed Jun. 25, 2012.

Office Action for U.S. Appl. No. 13/651,169, dated Mar. 7, 2013.

Office Action for U.S. Appl. No. 13/174,077, dated Apr. 1, 2013.

Notice of Allowance for U.S. Appl. No. 13/481,696, dated Sep. 30, 2013.

International Search Report and Written Opinion for PCT/US2013/042746, filed on May 24, 2013.

Notice of Allowance for U.S. Appl. No. 13/651,169, dated Oct. 28, 2013.

Notice of Allowance for U.S. Appl. No. 13/194,500, dated Oct. 28, 2013.

Office Action for U.S. Appl. No. 13/194,479, dated Sep. 25, 2013.

Liu, Ming et al., "rFGA: CMOS-Nano Hybrid FPGA using RRAM components", IEEE International Symposium on Nanoscale Architectures (NANOARCH 2008), Jun. 12-13, 2008, pp. 93-98, Anaheim, CA.

Office Action for U.S. Appl. No. 13/525,096, dated Dec. 27, 2013.

Office Action for U.S. Appl. No. 13/531,449, dated Jun. 30, 2014.

Office Action for U.S. Appl. No. 14/166,691, dated Jul. 9, 2014.

NON-VOLATILE VARIABLE CAPACITIVE DEVICE INCLUDING RESISTIVE MEMORY CELL

CROSS-REFERENCES TO RELATED APPLICATIONS

This application is a continuation of U.S. patent application Ser. No. 12/815,318 filed on Jun. 14, 2010, now issued as U.S. Pat. No. 8,411,485 on Apr. 2, 2013, the disclosures of which are hereby incorporated by reference for all purposes.

BACKGROUND OF THE INVENTION

The present invention relates to a non-volatile variable capacitive device including a resistive memory cell.

Resistive memory cells have generated significant interest recently. Many believe its use as a resistive random-access memory (RRAM) could be an excellent candidate for ultra-high density non-volatile information storage. A typical resistive memory cell has an insulator layer provided between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. Resistance switching has also been explained by field assisted diffusion of ions in $TiO_2$ and amorphous silicon (a-Si) films.

In the case of a-Si structures, voltage-induced diffusion of metal ions into the silicon leads to the formation of conductive filaments that reduce the resistance of the a-Si structure. These filaments remain after the biasing voltage is removed, thereby giving the device its non-volatile characteristic, and they can be removed by reverse flow of the ions back toward the metal electrode under the motive force of a reverse polarity applied voltage.

The non-volatile characteristics and its simple configuration enables the resistive memory cell to be implemented in a wide range of different applications.

BRIEF SUMMARY OF THE INVENTION

The present invention relates to a non-volatile variable capacitive device including a resistive memory cell. In an embodiment, a resistive memory cell is integrated with a transistor, e.g., a MOS transistor, to define a non-volatile memory device. In another embodiment, a resistive memory cell is integrated with a capacitor to define a variable capacitor that can be programmed Various other devices may be implemented using a resistive memory cell.

In an embodiment, a non-volatile variable capacitive device includes a capacitor defined over a substrate, the capacitor having an upper electrode; and a resistive memory cell having a first electrode, a second electrode, and a switching layer provided between the first and second electrodes, the resistive memory cell being configured to be placed in first and second resistive states according to electrical signals received, the resistive memory cell configured to behave substantially as a resistor in the first state and substantially as a capacitor in the second state, wherein the upper electrode of the capacitive device is coupled to the second electrode of the resistive memory cell, and wherein the resistive memory cell is a two-terminal device.

In an embodiment, the capacitor and the resistive memory cells are connected in series, the upper electrode of the capacitor and the second electrode of the resistive memory cell sharing a common node.

In an embodiment, the capacitor and the resistive memory cell behave as a single capacitor with a resistor connected to an electrode of the capacitor when the resistive memory cell is placed in first state, and the capacitor and the resistive memory cell behave as two capacitors in series when the resistive memory cell is in the second state.

In an embodiment, the non-volatile variable capacitive device is configured to be a non-volatile memory device, the upper electrode of the capacitor being a floating gate of a transistor, and the capacitor and the resistive memory cells are connected in series. The transistor has a gate oxide thickness of no more than 50 Å or no more than 30 Å.

In another embodiment, the resistive memory cell is configured to be placed in a low resistive state using a program voltage of no more than 5 volts.

In another embodiment, a resistance ratio between the first resistive state and the second resistive state is at least 10E3. The resistive memory cell has a resistance of at least 10E7 Ohms in the second resistive state. The switching layer of the resistive memory cell includes non-crystalline silicon.

In yet another embodiment, the first electrode of the resistive memory cell includes silver, the switching layer of the resistive memory cell includes amorphous silicon, and the second electrode of the resistive memory cell includes p-type polysilicon.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to a non-volatile variable capacitive device including a resistive memory cell. In an embodiment, a resistive memory cell is integrated with a transistor, e.g., a MOS transistor, to define a non-volatile memory device. In another embodiment, a resistive memory cell is integrated with a capacitor to define a variable capacitor that can be programmed Various other devices may be implemented using a resistive memory cell.

Figure 1:
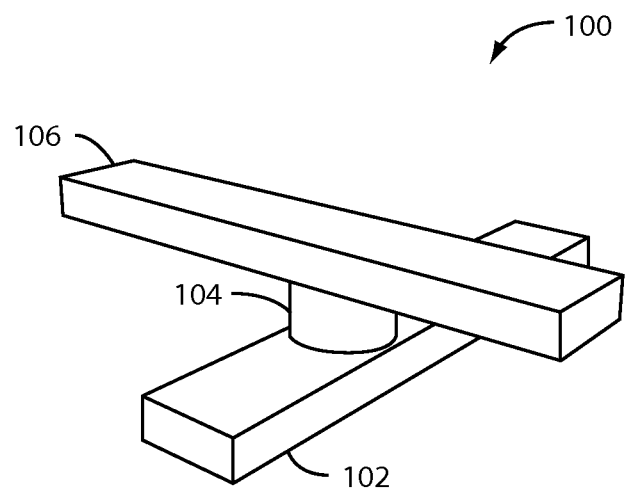
FIG. 1 illustrates a non-volatile solid state resistive device including a bottom electrode, a switching medium, and a top electrode according an embodiment of the present invention.

FIG. 1 illustrates a non-volatile solid state resistive device 100 including a bottom electrode 102, a switching medium 104, and a top electrode 106 according an embodiment of the present invention. Switching medium 104 exhibits a resistance that can be selectively set to various values, and reset, using appropriate control circuitry. Device 100 is a resistive memory cell or a two-terminal nanoscale resistive random-access memory (RRAM) in the present embodiment.

RRAM is a two-terminal device having a switching medium provided between top and bottom electrodes. The resistance of the switching medium can be controlled by applying an electrical signal to the electrodes. The electrical signal may be current-based or voltage-based. As used herein, the term "RRAM" or "resistive memory device" or "resistive memory cell" refers to a memory device that uses a switching medium whose resistance can be controlled by applying an electrical signal without ferroelectricity, magnetization and phase change of the switching medium.

In the present embodiment, device 100 is amorphous-silicon-based RRAM and uses amorphous silicon as switching medium 104. The resistance of the switching medium 104 changes according to formation or retrieval of a conductive filament inside the a-Si switching medium according to voltage applied. Top electrode 106 is a conductive layer containing silver (Ag) and acts as the source of filament-forming ions in the a-Si structure. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), and cobalt (Co). Bottom electrode 102 is a boron-doped or other p-type polysilicon electrode 130 that is in contact with a lower end face of the a-Si structure.

Figure 2:
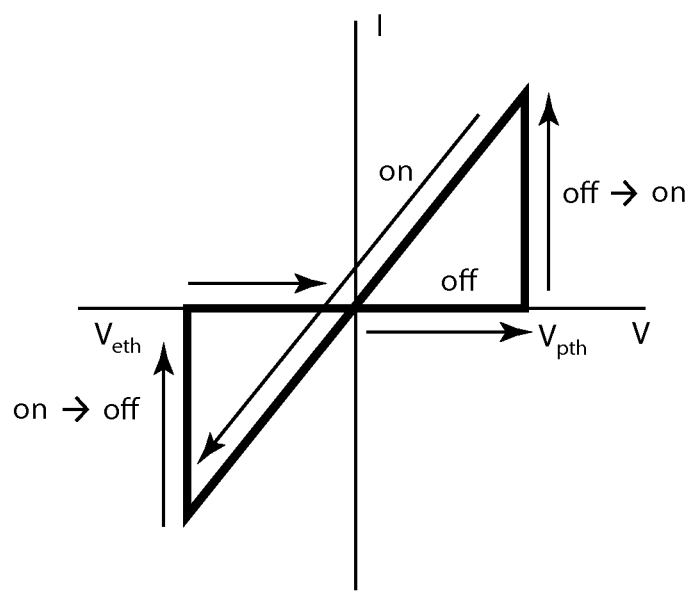
FIG. 2 illustrates resistance switching characteristics of device according to an embodiment of the present invention.

FIG. 2 illustrates resistance switching characteristics of device 100 according to an embodiment of the present invention. The switching medium displays a bipolar switching mechanism. The resistance of the switching medium changes depending on the polarity and magnitude of the signal applied to the switching medium via the top and bottom electrodes. The device is changed into ON-state (low resistance state) when a positive voltage equal to or greater than a program threshold voltage (or program voltage) $V_{pth}$ is applied. In an embodiment, the program voltage ranges between 2 volts to 5 volts depending on the materials used for the switching medium and the top electrode. In another embodiment, the program voltage is 1 volt. The device is switched back to OFF-state (high resistance state) when a negative voltage of equal or greater magnitude than erase threshold voltage (or erase voltage) $V_{eth}$ is applied. In an embodiment, the erase voltage ranges from −2 volts to −5 volts. The device state is not affected if the bias applied is between two threshold voltages $V_{pth}$ and $V_{eth}$, which enables a low-voltage read process. Once device 100 is set to a specific resistance state, the device retains the information for a certain period (or retention time) without electrical power.

Figure 3A:
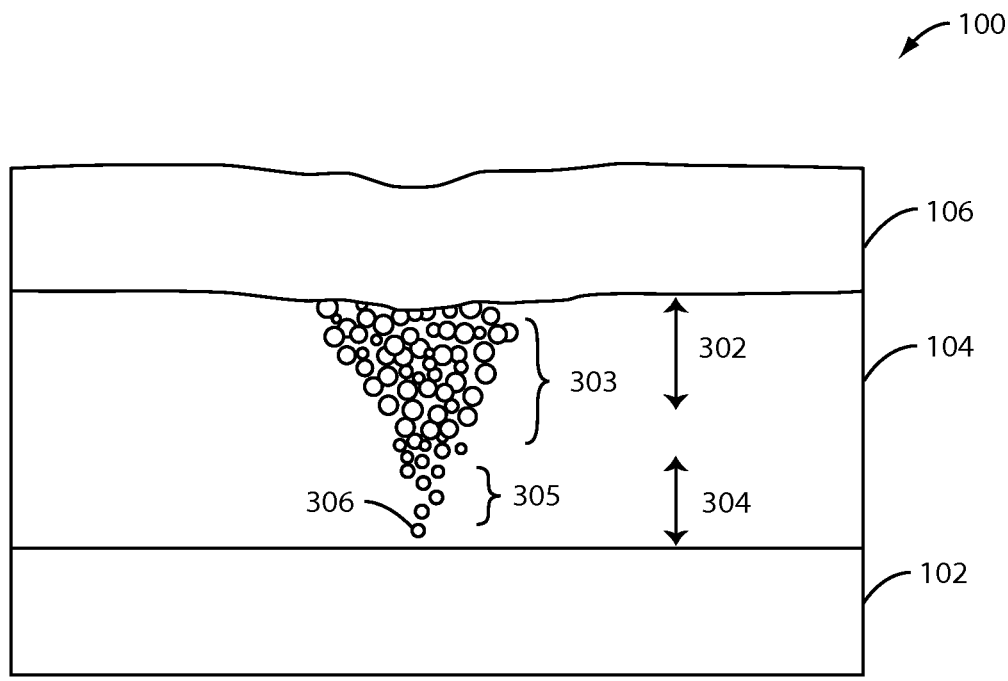
FIG. 3A illustrates a two-terminal device that is placed in an ON state by applying a program voltage $V_{pth}$ between the top electrode and the bottom electrode
Figure 3B:
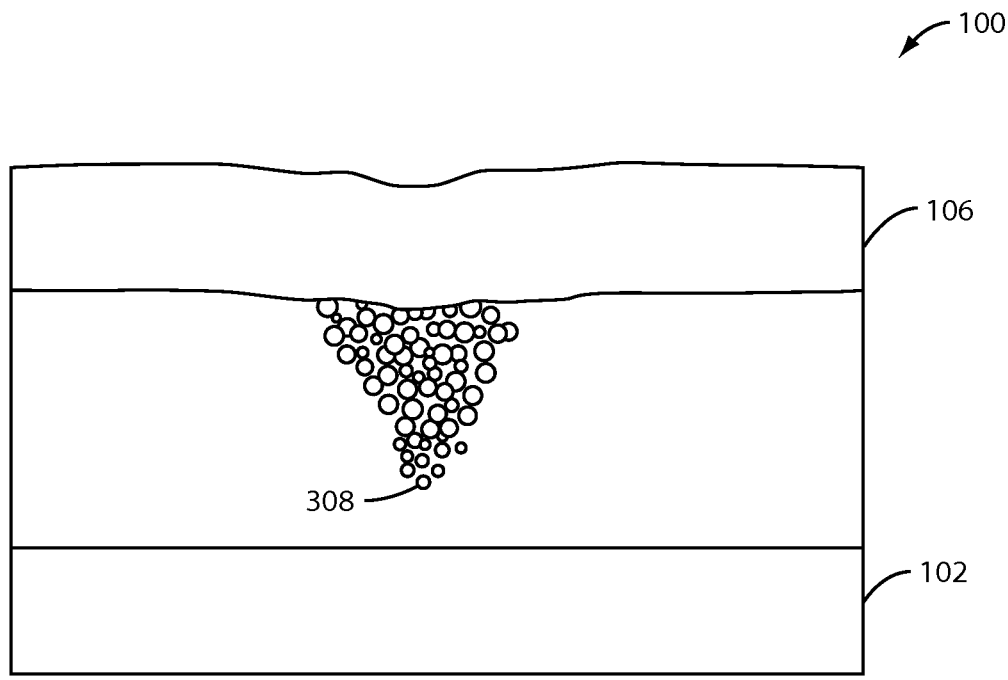
FIG. 3B illustrates a two-terminal device that is placed in an OFF state by applying an erase voltage $V_{eth}$ between the top electrode and the bottom electron.

FIGS. 3A and 3B illustrate a switching mechanism of device 100 during ON and OFF states according to an embodiment of the present invention. The switching in an a-Si medium 104 is based on formation and retrieval of a nanoscale conductive filament (or a plurality of filaments) in a filament region in the a-Si medium according to the program and the erase voltages applied to the electrodes of device 100.

FIG. 3A illustrates device 100 that is placed in an ON state by applying a program voltage $V_{pth}$ to the top electrode. Switching medium 104 made of a-Si is provided between bottom electrode 102 and top electrode 106. An upper portion of the switching medium includes a metallic region (or conductive path) 302 that extends from the top electrode to about 10 nm above the bottom electrode. Metallic region 302 is formed during an electroforming process when a slightly larger voltage (e.g., 3~5 volts), than a subsequent program voltage is applied to the top electrode. This relatively large voltage causes the electric field induced diffusion of the metal ions from the top electrode toward the bottom electrode, thereby forming a continuous conductive path 303. A lower portion of the switching medium defines a filament region 304 wherein a filament 305 is formed when a program voltage $V_{pth}$ is applied after the electroforming process. In certain implementations, the conductive path 303 and the filament 305 can be also formed together in a single step, e.g., during the electroforming process. The filament comprises a series of metal particles that are trapped in defect sites in a lower portion of the switching medium when a program voltage applied provides sufficient activation energy to push a number of metal ions from metallic region 302 toward the bottom electrode.

Filament 305 is believed to be comprised of a collection of metal particles that are separated from each other by the non-conducting switching medium and does not define a continuous conductive path, unlike the path 303 in the metallic region. Filament 305 extends about 2-10 nm depending on implementation. The conduction mechanism in the ON state is electrons tunneling through the metal particles in the filament. The device resistance is dominated by the tunneling resistance between a metal particle 306 and the bottom electrode. Metal particle 306 is a metal particle in the filament region that is closest to the bottom electrode and is the last metal particle in the filament region in the ON state.

FIG. 3B illustrates device 100 that is placed in an OFF state by applying an erase voltage $V_{eth}$ to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a greater distance than the metal particle 306 during the ON state. This increased distance between the metal particle 308 and the bottom electrodes places the device 100 in a high resistance state compared to the ON state. In an embodiment, the resistance ratio between the ON/OFF states ranges from 10E3 to 10E7. Device 100 behaves likes a resistor in the ON state and like a dielectric in the OFF state. In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state and device 100.

In an embodiment, device 100 exhibits controllable ON-state current flow of 10 nA-10 mA and endurance of greater 10E6. Device 100, however, exhibits relatively low retention time of 6 years at room temperature. One reason for the low retention time for device 100 is believed to be the presence of only a small number of metal particles trapped in the defect sites in filament region 304. With a limited number of metal particles in the filament region, dislodging only a few metal particles can significantly increase the resistance of device 100 and cause the device to switch from ON state to OFF state. In order to increase the retention time, device 100 should be provided with a greater number of metal particles in the filament region by increasing the number of defect sites in the filament region to trap the metal particles therein.

Figure 4A:
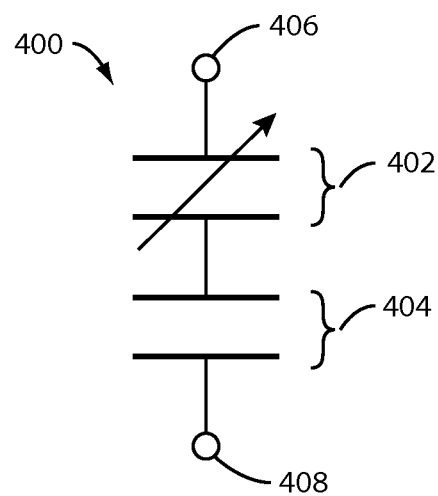
FIG. 4A illustrates an equivalent circuit for a resistive memory cell integrated with a capacitor to define a programmable variable capacitor according to an embodiment of the present invention.

Device 100, however, has p-type polysilicon as bottom electrode 102 and amorphous silicon as switching medium 104. Since the a-Si switching medium 104 is formed on polysilicon bottom electrode 102, the amorphous silicon formed thereon is substantially homogenous and have relatively few defect sites at the interface between a-Si and p-type polysilicon. Fewer defect sites at the interface results in fewer metal particles that could be trapped in the filament region. Accordingly, even a minor variance in the defect site formation can result in a significant change in percentage of available defect sites needed to trap the metal particles in the filament region. This can cause the retention time to fluctuate greatly from a device to a device and from one programmed state to another. Accordingly, it would be desirable to provide the filament region of the switching medium with a higher defect density in order to increase the retention time and make the retention time more predictable. The defect site formation, however, needs to be controllable so that too many defect sites are not created in the filament region which would seriously diminish the endurance of device 400, as explained in U.S. patent application Ser. No. 12/582,086, filed on Oct. 20, 2009, which is incorporated by reference in its entirety FIG. 4A illustrates an equivalent circuit for a resistive memory cell 402 integrated with a capacitor 404 to define a programmable variable capacitor 400 according to an embodiment of the present invention. Programmable variable capacitor 400 has a stack of two two-terminal devices, a resistive memory cell 402 and a capacitor 404, that are connected between nodes 406 and 408. The bottom electrode of resistive memory cell 402 is connected in series to the top electrode of capacitor 404. Resistive memory cell 402 corresponds to device 100 and is configured to have resistance of no more than 10E4 Ohms in the ON state and greater than 10E8 Ohms in the OFF state in an embodiment. In another embodiment, resistive memory cell 402 may be configured to have different ON and OFF resistance values according to implementation.

Resistive memory cell 402 in effect behaves as a capacitor in the OFF state and as a resistor in the ON state. The total capacitance across nodes 406 and 408 is defined by: $1/C_T = 1/C_{402} + 1/C_{404}$, where $C_{402}$ refers to the capacitance of resistive memory cell 402 and $C_{404}$ refers to the capacitance of capacitor 404. The total capacitance increases when resistive memory cell 402 is turned ON and decreases when the resistive memory cell 402 is turned OFF. The total capacitance, therefore, can be programmed to have different values by turning the resistive memory cell ON or OFF. This programmed capacitance value may be retained for an extended time period, e.g., 5-10 years or more, according to the retention time of resistive memory cell 402. In an embodiment, programmable variable capacitor 400 may be programmed to have three or more capacitance values by integrating it with resistive memory cell 402 that can be placed in three or more resistive states.

Figure 4B:
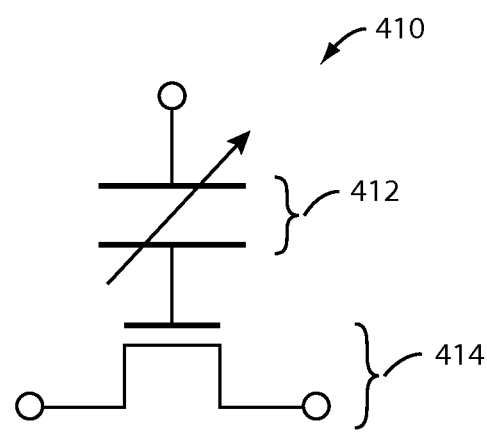
FIG. 4B illustrates an equivalent circuit for a resistive memory cell integrated with a transistor to define a non-volatile memory device according to an embodiment of the present invention.

FIG. 4B illustrates an equivalent circuit for a resistive memory cell integrated with a transistor to define a non-volatile memory device 410 according to an embodiment of the present invention. Non-volatile memory device 410 integrates a resistive memory cell 412 and a transistor 414, e.g., a MOS transistor. The bottom electrode of resistive memory cell 412 is connected in series to the gate electrode of transistor 414. Resistive memory cell 412 corresponds to device 100 and is configured to have resistance of no more than 10E4 Ohms in the ON state and greater than 10E8 Ohms in the OFF state in an embodiment. In another embodiment, resistive memory cell 412 may be configured to have different ON and OFF resistance values according to implementation.

As explained above, resistive memory cell 412 in effect behaves as a capacitor in the OFF state and as a resistor in the ON state. The gate electrode of transistor 414 is configured to float electrically, so that transistor 414 in effect functions as a capacitor. The total capacitance increases when the resistive memory cell 412 is ON and decreases when the resistive memory cell 412 is OFF. The total capacitance, therefore, can be programmed to have different values by turning the resistive memory cell ON or OFF. This programmed capacitance value may be retained for an extended time period according to the retention time of resistive memory cell 412. In an embodiment, transistor 414 is configured to be programmed to have three or more different capacitance values by integrating it with resistive memory cell 412 that can be placed in three or more resistive states.

Figure 5:
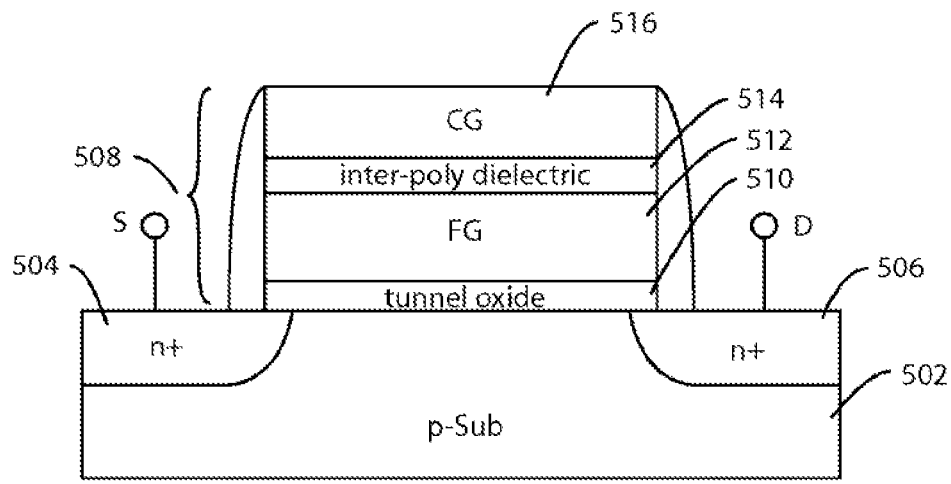
FIG. 5 illustrates a conventional non-volatile memory device.

As illustrated above, the resistive memory cell or RRAM may be implemented into various different programmable devices. Given its small cell size and scalability, the resistive memory cell shows a great promise as an ultra-high density non-volatile memory device. Currently flash memory is being the ultra-high density non-volatile memory device of choice. FIG. 5 illustrates a flash memory cell 500 including a p-type substrate 502, a source region 504, a drain region 506, and a gate structure 508 defined therebetween. Gate structure 508 includes a tunnel oxide 510, a floating gate 512 made of polysilicon provided over the tunnel oxide, an interpoly dielectric layer 514 over the floating gate, and a control gate 516 made of polysilicon over the interpoly dielectric layer. Flash memory cell 500 uses a single transistor to store a plurality of bits, e.g., logic-0 and logic-1, and has enabled implementation of a highly dense non-volatile memory device to be realized the past twenty years. One difficulty currently encountered in the continued scaling down of the flash memory cell size has been the tunnel oxide. The tunnel oxide needs to be of a sufficient thickness to properly regulate the tunneling of electrons into and out of the floating. The tunneling oxide currently remains at a thickness of about 70 Å or greater. It is currently believed that the tunneling oxide cannot properly regulate the tunneling of electrons if its thickness is reduced to about 60 Å or less.

Another difficulty in scaling down the size of the flashing memory cell has been height of the gate structure. The gate structure needs to be relatively high, e.g., 150 nm, to provide a sufficiently large surface area needed for the desired coupling ratio between the control gate and the floating gate. If the coupling ratio is not sufficiently high, the greater program voltage would be needed to program the flash memory cell, which would require more power consumption and bigger voltage pumps in the peripheral region of the flash memory.

Figure 6A:
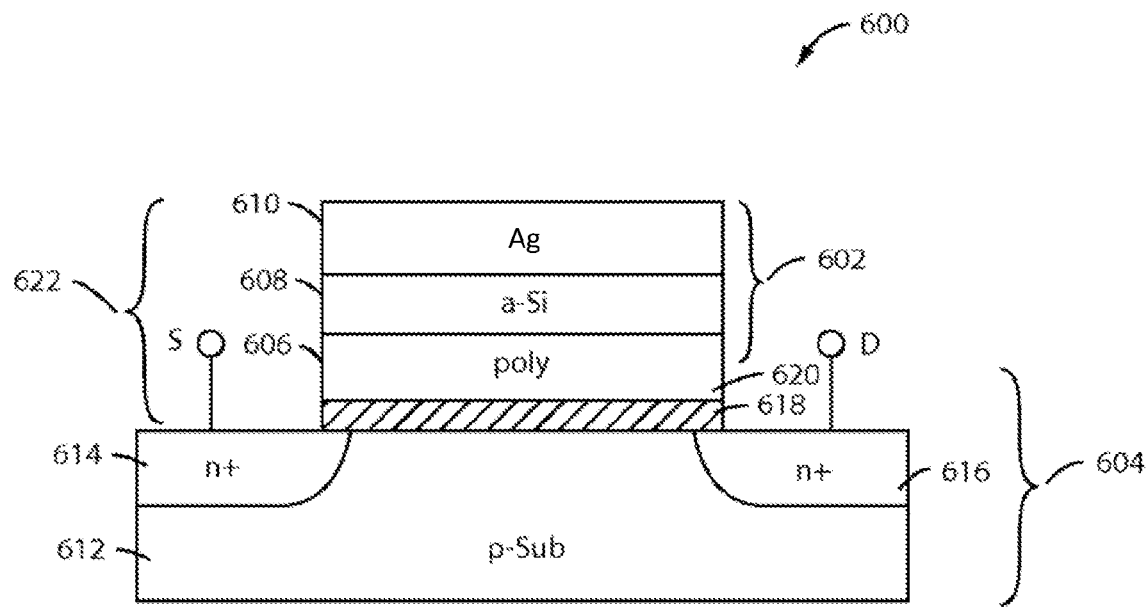
FIG. 6A illustrates a cross-sectional view of a resistive memory cell integrated with a transistor to define a non-volatile memory device according to an embodiment of the present invention.

FIG. 6A illustrates a non-volatile memory device 600 according to an embodiment of the present invention. Non-volatile memory device 600 includes a resistive memory cell 602 and a transistor 604 and is a type of programmable variable capacitor. Device 600 does not require a tunnel oxide for transistor 604 since the resistive state of resistive memory cell 602 is used to store information. Device 600 also does not require a high gate structure since the program voltage for device 600 does not depend on the coupling ratio between the control gate and the floating gate as in the flash memory cell.

Resistive memory cell 602 includes a bottom electrode 606, a switching medium 608, and a top electrode 610 according an embodiment. In an embodiment, bottom electrode 606, switching medium 608, and top electrode 610 have thicknesses of 20 nm, 20 nm, and 20 nm, respectively. Switching medium 608 exhibits a resistance that can be selectively set to various values, and reset, by applying electrical signals to the electrodes. The electrical signal may be current-based or voltage-based.

Resistive memory cell 602 is amorphous-silicon-based RRAM and uses amorphous silicon as switching medium 606. The resistance of the switching medium 606 changes according to formation or retrieval of a conductive filament inside the a-Si switching medium according to electrical signals applied.

Top electrode 610 includes silver (Ag) as the source of filament-forming metal ions in the switching medium. In an embodiment, top electrode 610 is an Ag layer with a thickness of 60 nm. In other embodiments, the top electrode can be a stacked structure. For example, an Ag layer of about 30 nm is deposited on top of a-Si and another metal (e.g., TiN/W) of about 30 nm can be deposited on top of the Ag layer. The thickness may vary depending on the device size and implementation. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co) or metal stacks.

Bottom electrode 606 is a boron-doped or other p-type polysilicon electrode and contacts a lower surface of the a-Si switching layer. The p-type polysilicon layer has a thickness of 20 nm and may vary depending on implementation.

The p-type polysilicon of bottom electrode 606 facilitates the defect site formation in the dual switching layer to be controllable by enabling the tuning of the amorphous silicon deposition on the p-type polysilicon, so that the defect density in the filament region does not become too high. When a non-silicon-based material, e.g., Nickel or other metal, is used as a platform whereon the amorphous silicon is formed, the inventors have found that the filament formation was difficult to control due to the excess number of defect sites formed at the a-Si/metal interface. Furthermore, a-Si can react with the bottom metal electrode during the a-Si deposition, giving a-Si and metal alloy (silicide) at the interface. Accordingly, in addition to serving as an electrode, the p-type polysilicon serves as a platform that enables defect formation in the a-Si switching layer to be controllable.

Switching medium 608 provided between the top and bottom electrodes includes amorphous silicon (a-Si) and exhibits a resistance that can be selectively set to various values, and reset, by applying appropriate electrical signals. Switching medium 608 has a thickness of 20-80 nm in the present embodiment. In other embodiment, the switching layer may have a different thickness depending on the device size and configuration. As used herein, the term "amorphous silicon" refers to amorphous silicon, an amorphous phase that includes small grains of crystalline silicon or amorphous polysilicon that exhibits controllable resistance, a combination thereof, or the like.

In an embodiment, resistive memory cell 602 is configured to have resistance of no more than 10E4 Ohms in the ON state and greater than 10E8 Ohms in the OFF state. Resistive memory cell 602 may be configured to have different ON and OFF resistance values according to implementation. Resistive memory cell 602 in effect behaves as a capacitor in the OFF state and as a resistor in the ON state.

Transistor 604 includes a semiconductor substrate 612, a source region 614, a drain region 616 separated from the source region by a channel, a gate oxide 618 provided over the channel, and a gate electrode 620 provided over the gate oxide. Transistor 604 uses a gate oxide instead of a tunnel oxide since tunneling electrons are not used to program or erase device 600. Gate oxide 618 accordingly may be configured to have significantly less thickness than a tunnel oxide. Gate oxide 618 has a thickness of 50 A or less, e.g., 20-30 A or 10-15 A, in an embodiment. Gate electrode 620 is configured to float electrically. In an embodiment, gate electrode 620 shares the same polysilicon structure with bottom electrode 606 of resistive cell 602.

In the present embodiment, a stack 622 including resistive memory cell 602 and gate oxide 618 has a height of no more than 80 nm, (e.g., about 65 nm, where Ag is 20 nm, a-Si is 20 nm, pSi is 20 nm, and Ox is 5 nm). In another embodiment, stack 622 has a height of no more than 60 nm, (e.g., about 43 nm, where Ag is 15 nm, a-Si is 10 nm, pSi is 15 nm, and Ox is 3 nm). Stack 622 (or gate stack) accordingly has significantly smaller height than a conventional flash memory cell.

The total capacitance for device 600 is defined by: $1/C_T = 1/C_{602} + 1/C_{604}$, where $C_{602}$ refers to the capacitance of resistive memory cell 602 and $C_{604}$ refers to the capacitance of transistor 604. The total capacitance increases when resistive memory cell 602 is turned ON and decreases when the resistive memory cell 602 is turned OFF. The total capacitance, therefore, can be programmed to have different values by turning the resistive memory cell ON or OFF. This programmed capacitance value may be retained for an extended time period according to the retention time of resistive memory cell 602. In an embodiment, programmable variable capacitor 400 may be programmed to have three or more capacitance values by integrating it with resistive memory cell 602 that can be placed in three or more resistive states.

Figure 6B:
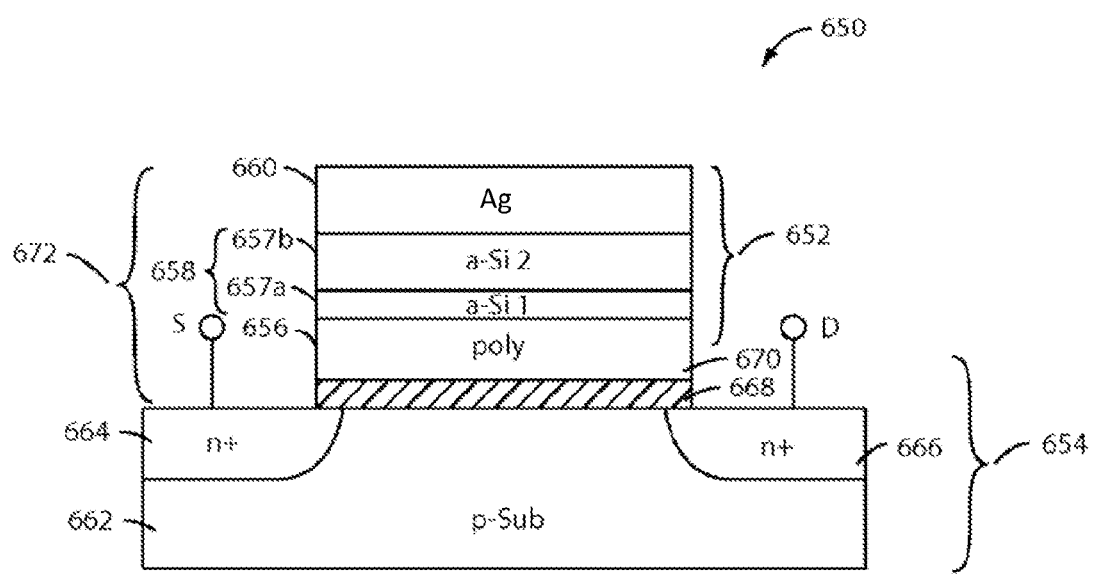
FIG. 6B illustrates a cross-sectional view of a resistive memory cell integrated with a transistor to define a non-volatile memory device according to another embodiment of the present invention.

FIG. 6B illustrates a non-volatile memory device 650 according to an embodiment of the present invention. Non-volatile memory device 650 includes a resistive memory cell 652 and a transistor 654 and is a type of programmable variable capacitor. Device 650 does not require a tunnel oxide for transistor 604 since the resistive state of resistive memory cell 652 is used to store information. Device 650 also does not require a high gate structure since the program voltage for device 650 does not depend on the coupling ratio between the control gate and the floating gate as in the flash memory cell.

Resistive memory cell 652 includes a bottom electrode 656, a dual switching layer 658, and a top electrode 660 according an embodiment. In an embodiment, bottom electrode 656, dual switching layer 658, and top electrode 660 have thicknesses of 20 nm, 20 nm, and 20 nm, respectively. Resistive memory cell 652 can be placed in a plurality of resistive states, e.g., ON or OFF states, by applying electrical signals to the electrodes. The electrical signal may be current-based or voltage-based.

Resistive memory cell 652 is amorphous-silicon-based RRAM and uses amorphous silicon as dual switching layer 656. The resistance of the switching layer 656 changes according to formation or retrieval of a conductive filament inside the a-Si switching layer according to voltage or current applied to the electrodes.

Top electrode 660 includes silver (Ag) as the source of filament-forming metal ions in the switching layer. In an embodiment, top electrode 660 is an Ag layer with a thickness of 150 nm. In other embodiments, the top electrode can be a stacked structure. For example, an Ag layer of about 50 nm is deposited on top of a-Si and another metal (e.g., TiN/W) of about 100 nm can be deposited on top of the Ag layer. The thickness may vary depending on the device size and implementation. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co) or metal stacks.

Bottom electrode 656 is a boron-doped or other p-type polysilicon electrode and contacts a lower surface of the a-Si switching layer. In an embodiment, bottom electrode 656 includes a metal layer (not shown), as described in U.S. patent application Ser. No. 12/582,086, filed on Oct. 20, 2009, which is assigned to the common assignee and is incorporated by reference in its entirety herein. The p-type polysilicon layer has a thickness of 30 nm and may vary depending on implementation.

The p-type polysilicon of bottom electrode 656 facilitates the defect site formation in the dual switching layer to be controllable by enabling the tuning of the amorphous silicon deposition on the p-type polysilicon, so that the defect density in the filament region does not become too high.

Dual switching layer 658, provided between the top and bottom electrodes, includes amorphous silicon (a-Si) and exhibits a resistance that can be selectively set to various values, and reset, by applying appropriate electrical signals. Dual switching layer 658 includes a first a-Si structure 412 having a thickness of 2-15 nm and a second a-Si structure 657b having a thickness of 20-80 nm. The thicknesses of these amorphous silicon structures vary depending on the device size and configuration.

First and second a-Si structures 657a and 657b have different defect densities. The first a-Si structure contacting the p-type polysilicon layer of bottom electrode 656 is made to have a higher defect density than the second a-Si structure in order to facilitate the filament formation therein and increase the retention time of the device. Although the present embodiment illustrates switching layer 658 as having two different types of layers, the switching layer 658 may have more than two different types of layers in other embodiments or a single layer having a defect density gradient.

In an embodiment, resistive memory cell 652 is configured to have resistance of no more than 10E4 Ohms in the ON state and greater than 10E8 Ohms in the OFF state. Resistive memory cell 652 may be configured to have different ON and OFF resistance values according to implementation. Resistive memory cell 652 in effect behaves as a capacitor in the OFF state and as a resistor in the ON state.

Transistor 654 includes a semiconductor substrate 652, a source region 654, a drain region 656 separated from the source region by a channel, a gate oxide 658 provided over the channel, and a gate electrode 670 provided over the gate oxide. The semiconductor substrate may be a silicon substrate or a compound substrate of a III-V or II-VI type. In an embodiment, the substrate is not made of semiconductor material, e.g., made of plastic.

Transistor 654 uses a gate oxide instead of a tunnel oxide since tunneling electrons are not used to program or erase device 650. Gate oxide 658 accordingly may be configured to have significantly less thickness than a tunnel oxide used in floating gate structures. Gate oxide 658 has a thickness of 50 Å or less, e.g., 20-30 Å or 10-20 Å, in an embodiment. Gate electrode 670 is configured to float electrically. In an embodiment, gate electrode 670 shares the same polysilicon structure with bottom electrode 656 of resistive cell 652.

In the present embodiment, a stack 672 including resistive memory cell 652 and gate oxide 658 has a height of no more than 80 nm, (e.g., about 65 nm, where Ag is 20 nm, a-Si is 20 nm, pSi is 20 nm, and Ox is 5 nm). In another embodiment, stack 672 has a height of about 40 nm. Stack 672 (or gate stack) accordingly has significantly smaller height than a conventional flash memory cell.

The total capacitance for device 650 is defined by: $1/C_T = 1/C_{652} + 1/C_{654}$, where $C_{652}$ refers to the capacitance of resistive memory cell 652 and $C_{654}$ refers to the capacitance of transistor 654. The total capacitance increases when resistive memory cell 652 is turned ON and decreases when the resistive memory cell 652 is turned OFF. The total capacitance, therefore, can be programmed to have different values by turning the resistive memory cell ON or OFF. This programmed capacitance value may be retained for an extended time period according to the retention time of resistive memory cell 652. In an embodiment, programmable variable capacitor 650 may be programmed to have three or more capacitance values by integrating it with resistive memory cell 652 that can be placed in three or more resistive states.

Figure 7A:
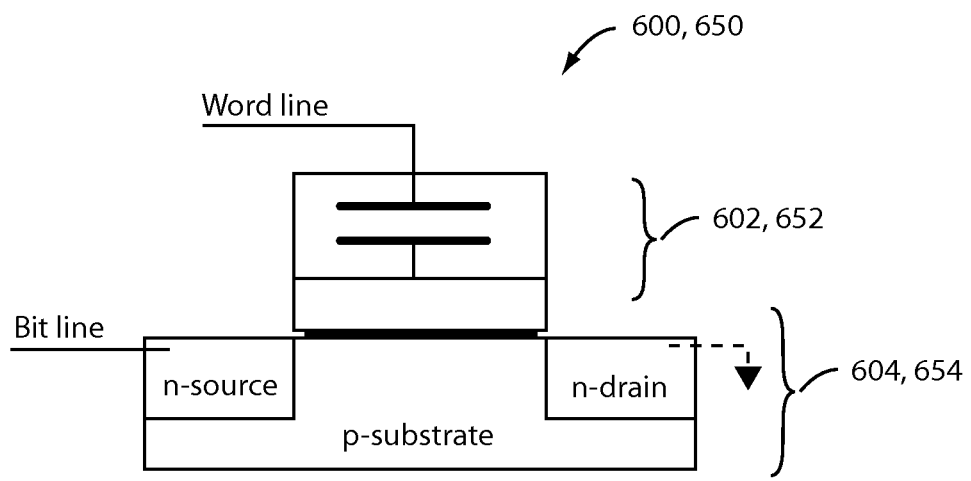
FIGS. 7A-7B illustrate a non-volatile memory device and an equivalent circuit thereof when the resistive memory cell of the non-volatile memory device is in an OFF state according an embodiment of the present invention.
Figure 7B:
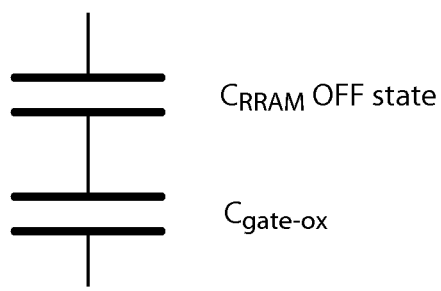

FIGS. 7A-7B illustrate the non-volatile memory device 600, 650 and an equivalent circuit thereof when the resistive memory cell of the non-volatile memory device is in an OFF state according an embodiment of the present invention. Device 600 includes resistive memory cell 602 and transistor 604. Resistive memory cell 602 is in a high resistive state, or OFF state, and functions primarily as a capacitor. Accordingly, device 600 is provided with a low total capacitance and transistor 604 is turned OFF.

Figure 8A:
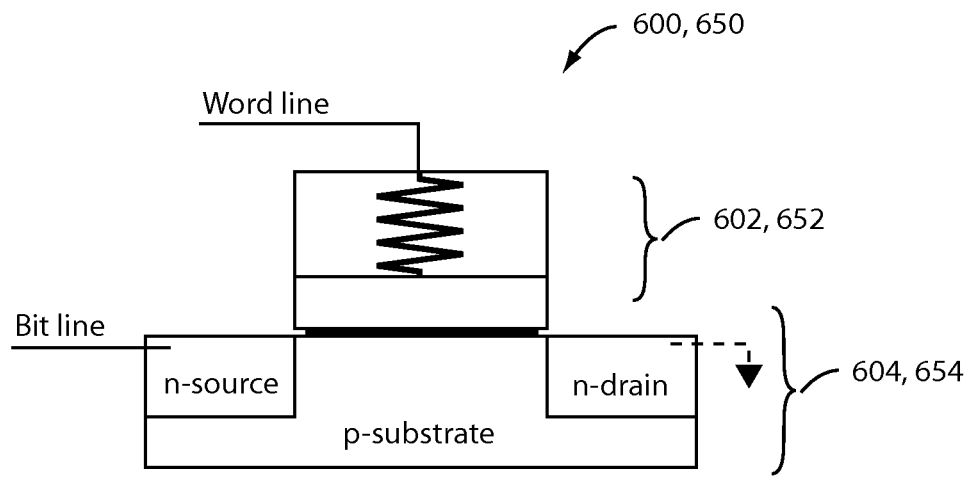
FIGS. 8A-8B illustrate a non-volatile memory device and an equivalent circuit thereof when the resistive memory cell of the non-volatile memory device is in an ON state according an embodiment of the present invention.
Figure 8B:
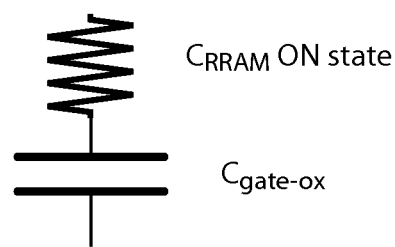

FIGS. 8A-8B illustrate the non-volatile memory device 600, 650 and an equivalent circuit thereof when the resistive memory cell of the non-volatile memory device is in an ON state according an embodiment of the present invention. A program voltage $V_{pth}$ (e.g., 3 volts or less) is applied to the top electrode of device 600 (or device 650) to turn ON resistive memory cell 602. Resistive memory cell 602 is placed in a lower resistive state and functions primarily as a resistor. Device 600 is provided with a high total capacitance and transistor 604 is turned ON. Accordingly, the non-volatile memory device 600, 650 may used effectively to store information. Non-volatile memory device 600, 650 requires a gate stack that is significantly smaller and the program/erase voltage is significantly lower than the conventional flash memory cell. Device 600, 650 may be implemented in a various cell array structures, e.g., NAND, NOR, and crossbar, to provide an ultra-high density non-volatile memory device.

Figure 9:
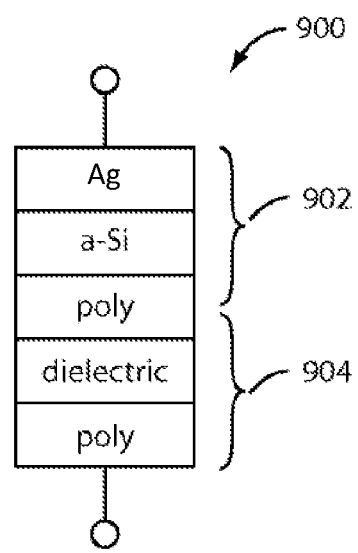
FIG. 9 illustrates a cross-sectional view of a resistive memory cell integrated with a capacitor to define a programmable variable capacitor according to an embodiment of the present invention.

A number of embodiments have been described. Nevertheless, it will be understood that various modifications may be made without departing from the spirit and scope of the invention. For example, device 600, 650 may be implemented using a resistive memory cell and a capacitor as shown in FIG. 9. FIG. 9 shows a programmable variable capacitor 900 including a resistive memory cell 902 and a capacitor 904. Accordingly, other embodiments are within the scope of the following claims.

What is claimed is:

1. A non-volatile variable capacitive device, comprising:
   a device disposed upon a substrate including a gate and a gate oxide disposed above the substrate, wherein a first capacitive device is defined over the substrate, and wherein the gate is an upper electrode of the first capacitive device; and
   a resistive memory cell having a first electrode, a second electrode, and a switching layer provided between the first and second electrodes, wherein the resistive memory cell is configured to be placed in first and second resistive states in response to electrical signals applied thereto, wherein the resistive memory cell is configured to behave substantially as a resistor in the first state and substantially as a second capacitive device in the second state,
   wherein the upper electrode of the first capacitive device is coincident to the second electrode of the resistive memory cell, and
   wherein the resistive memory cell comprises a two-terminal device.

2. The non-volatile variable capacitive device of claim 1, wherein the first capacitive device and the resistive memory cell behave as a single capacitor with a resistor coupled to the upper electrode of the first capacitive device when the resistive memory cell is placed in first state, and
   wherein the first capacitive device and the resistive memory cell behave as two capacitors in series when the resistive memory cell is in the second state.

3. The non-volatile variable capacitive device of claim 1 further comprising a single conductive silicon-containing layer, wherein the single conductive layer comprises the gate and the second electrode.

4. The non-volatile variable capacitive device of claim 1 wherein the first electrode comprises a material selected from a group consisting of: silver, gold, nickel, aluminum, chromium, iron, manganese, tungsten, vanadium and cobalt.

5. The non-volatile variable capacitive device of claim 4, wherein the resistance of the resistive memory cell is changed according to formation or retrieval of a conductive filament inside the switching layer of the resistive memory cell comprising particles of the material of the first electrode.

6. The non-volatile variable capacitive device of claim 5, wherein the switching layer is configured to have a plurality of defect sites, wherein the particles of the material of the first electrode are removably disposed in the plurality of defect sites in response to the electrical signals.

7. The non-volatile variable capacitive device of claim 5 wherein a material of the switching layer is selected from a group consisting of; amorphous silicon and non-crystalline silicon.

8. The non-volatile variable capacitive device of claim 5, wherein the switching layer is selected from a group consisting of: a single switching layer material and dual switching layer material.

9. The non-volatile variable capacitive device of claim 5, further comprising:
   a single doped conductive silicon-containing layer, wherein the single conductive layer comprises the gate and the second electrode.

10. The non-volatile variable capacitive device of claim 5, wherein the switching layer is adjacent to the single doped conductive silicon-containing layer;
    wherein the switching layer comprises a first layer and a second layer, wherein the first layer and the second layer comprises a switching material, wherein the first layer comprises the switching layer having a first defect density, wherein the second layer comprises a second defect density, wherein the first defect density is different from the second defect density.

11. The non-volatile variable capacitive device of claim 10, wherein the second layer is adjacent to the single doped conductive silicon-containing layer; and
    wherein a defect density of the second layer is higher than a defect density of the first layer.

12. The non-volatile variable capacitive device of claim 1, wherein the device further comprises a source and drain disposed within the substrate, wherein a channel region is located within the substrate between the source and drain.

13. The non-volatile variable capacitive device of claim 1, wherein the resistive memory cell is configured to be placed in a third resistive states in response to electrical signals applied thereto, wherein the resistive memory cell is configured to behave substantially as a third capacitive device in the third state, wherein a capacitance associated with the second capacitive device is different from a capacitance associated with the third capacitive device.

14. A non-volatile variable capacitive device, comprising:
    a first capacitive device having upper and lower electrodes, wherein the upper and lower electrodes are separated by a first insulating layer, wherein the upper electrode comprises a gate; and
    a memory cell having a first electrode, a second electrode, and second insulating layer provided between the first and second electrodes, wherein the memory cell is configured to be placed in first and second states according to electrical signals received applied thereto, wherein the memory cell is configured to behave substantially as a resistor in the first state and substantially as a first capacitive device in the second state,
    wherein the upper electrode of the capacitive device is coincident to the second electrode of the memory cell.

15. The non-volatile variable capacitive device of claim 14, wherein the a capacitance of the non-volatile variable capacitive device while the memory cell is in the first state is different from a capacitance of the non-volatile variable capacitive device while the memory cell is in the second state.

16. The non-volatile variable capacitive device of claim 14, wherein the memory cell is configured to be placed in third state according to electrical signals received applied thereto, wherein the memory cell is configured to behave substantially as a third capacitive device in the third state, wherein a resistance of the second capacitive device is different from a resistance of the third capacitive device.

17. The non-volatile variable capacitive device of claim 14, wherein the memory cell is configured to be in the first state upon application of a write voltage across the memory cell.

18. The non-volatile variable capacitive device of claim 14, wherein the memory cell is configured to be in the second state upon application of an erase voltage across the memory cell.

19. The non-volatile variable capacitive device of claim 14, wherein the insulating layer comprises a plurality of defects, and
    wherein the insulating layer comprises a material selected from a group consisting of: amorphous silicon and non-crystalline silicon.

20. The non-volatile variable capacitive device of claim 19, wherein the insulating layer comprises a plurality of particles within defects of the plurality of defect, and wherein the plurality of particles originate from the first electrode.

* * * * *